United States Patent [19]

Koshikawa et al.

[11] Patent Number: 5,270,584
[45] Date of Patent: Dec. 14, 1993

[54] SEMICONDUCTOR INTEGRATED CIRCUIT

[75] Inventors: Yasuji Koshikawa; Tadahiko Sugibayashi; Takahiro Hara, all of Tokyo, Japan

[73] Assignee: NEC Corporation, Tokyo, Japan

[21] Appl. No.: 935,185

[22] Filed: Aug. 26, 1992

[30] Foreign Application Priority Data

Aug. 26, 1991 [JP] Japan .................................. 3-212545

[51] Int. Cl.⁵ .............................................. H03K 3/01
[52] U.S. Cl. ............................ 307/296.2; 307/362; 307/296.8
[58] Field of Search ............... 307/296.2, 296.8, 362, 307/350

[56] References Cited

U.S. PATENT DOCUMENTS

| | | | |
|---|---|---|---|
| 4,455,493 | 6/1984 | Morton et al. | 307/296.2 |
| 4,700,125 | 10/1987 | Takata et al. | 307/296.8 |
| 4,871,927 | 10/1989 | Dallavalle | 307/296.2 |
| 4,933,627 | 6/1990 | Hara | 307/296.8 |
| 4,948,995 | 8/1990 | Takahashi | 307/350 |
| 5,113,088 | 5/1992 | Yamamoto et al. | 307/296.2 |
| 5,120,993 | 6/1992 | Tsay et al. | 307/296.2 |
| 5,153,465 | 10/1992 | Sandhu | 307/296.8 |
| 5,157,287 | 10/1992 | Sakagami | 307/350 |
| 5,168,174 | 12/1992 | Naso et al. | 307/296.2 |
| 5,179,296 | 1/1993 | Ito | 307/296.2 |
| 5,191,235 | 3/1993 | Hara | 307/296.2 |

*Primary Examiner*—John T. Kwon
*Attorney, Agent, or Firm*—Sughrue, Mion, Zinn, Macpeak & Seas

[57] ABSTRACT

A semiconductor integrated circuit which comprises a detection circuit for detecting a voltage of a semiconductor substrate and a negative voltage generating circuit for generating a negative voltage to be supplied to the substrate in accordance with an output signal of the detection circuit. The detection circuit includes a first P-channel MOS transistor having a gate connected to a ground potential, a source connected to a power source and a drain connected to a node coupled to the detection circuit, and a second P-channel MOS transistor having a gate connected to the substrate, a source connected to the node and a drain connected to ground. Current does not flow from the external power source to the substrate, so that, even if the negative voltage generating circuit does not have its electric current supplying capacity increased, the voltage of the substrate can be detected. A buffer circuit outputting a signal in accordance with the node voltage level, and ring oscillators switched in accordance with the signal of the buffer circuit may be used in supplying an electric current to the negative voltage generating circuit.

9 Claims, 4 Drawing Sheets

SEMICONDUCTOR INTEGRATED CIRCUIT

BACKGROUND OF THE INVENTION

1. Field of the Invention

This invention relates to a semiconductor integrated circuit and more particularly, to a semiconductor integrated circuit of a dynamic random access memory (DRAM) or the like having a circuit for supplying a negative voltage to a semiconductor substrate.

2. Description of the Related Art

A DRAM having a single external power source is generally provided with a circuit for supplying a negative voltage to a semiconductor substrate therein. An example of a conventional negative voltage supplying circuit is shown in FIG. 1. This circuit comprises a ring oscillator section 5 including a ring oscillator for the active time use and a ring oscillator for the stand-by time use, a ring oscillator controlling section 1 for switching these two ring oscillators of the ring oscillator section 5 in accordance with a voltage of a substrate SUB, and a negative voltage generating section 6 for generating a predetermined negative voltage in accordance with an output of the ring oscillator section 5.

The ring oscillator controlling section 1 comprises a detection circuit 2 for detecting a voltage of the semiconductor substrate SUB, a buffer circuit 3 connected to the detection circuit 2 and a hysteresis circuit 4 connected to the buffer circuit 3. The detection circuit 2 has two P-channel MOS transistors Q1 and Q2 connected in series between a power source terminal TC for receiving an external power source voltage VCC and the semiconductor substrate SUB. The transistor Q1 has the gate connected to a ground potential end G, the source connected to the terminal TC and the drain connected to a node A. The transistor Q2 has the gate connected to the ground potential end G, the source connected to the node A and the drain connected to a substrate terminal TS for receiving a voltage of the substrate SUB. The node A is supplied with an output voltage of the detection circuit 2, that is, with a voltage VA corresponding to the detected voltage of the substrate SUB.

The buffer circuit 3 comprises two CMOS inverters IV0 and IV1 connected in series. The inverter IV0 as a first stage one has the input terminal connected to the node A and the inverter IV1 as a second stage one has the output terminal connected to a node B. The node B is supplied with an output voltage of the buffer circuit 3.

The hysteresis circuit 4 comprises two CMOS inverters IV2 and IV3 connected in series, and a P-channel MOS transistor Q5. The transistor Q5 has the source connected to the power source terminal TC, the drain connected to the node B, and the gate connected to a connection point of the inverters IV2 and IV3. The hysteresis circuit 4 receives the output voltage from the buffer circuit 3 and outputs a ring oscillator controlling voltage VAC to an output terminal TAC.

The ring oscillator controlling section 1, as shown above, supplies the controlling voltage VAC corresponding to the substrate voltage VSB detected by the detection circuit 2 to the ring oscillator section 5 through the output terminal TAC.

The ring oscillator section 5 supplies a voltage VRI corresponding to the controlling voltage VAC outputted from the ring oscillator controlling section 1 to the negative voltage generating section 6. The ring oscillator section 5 includes two ring oscillators respectively for the active and stand-by times uses and serves operably to select one of these two oscillators in accordance with whether the level of the controlling voltage VAC supplied from the ring oscillator section 5 is low (L) or high (H). The active time oscillator operates mainly in the active time to supply an electric current to the negative voltage generating section 6. It operates at a short period and has a large electric current supplying capacity. On the other hand, the stand-by time oscillator operates mainly in the stand-by time to supply an electric current to the negative voltage generating circuit 6. It operates at a long period in order to reduce the consumption of an electric current in the stand-by time and has a small electric current supplying capacity.

The negative voltage generating section 6 generates negative voltage corresponding to the voltage VRI supplied from the ring oscillator section 5 to supply to the substrate SUB.

Next, the operation of the conventional negative voltage supplying circuit as shown above will be explained below.

When the stand-by time oscillator is being operated to supply the voltage VRI to the negative voltage generating section 6, if the negative substrate voltage VBS is increased for any reason, that is, if the voltage VBS is approached from a certain negative value to zero, this change is detected by the detection circuit 2 and as a result, the voltage VA at the node A is increased to approach to zero. And, if the substrate voltage VSB is increased to a certain negative value and the voltage VA is attained to a predetermined threshold voltage, the controlling voltage VAC is switched its level from the L-state to the H-state. For example, it is rapidly changed from zero (0) V to a positive power source voltage VCC (for example, 5V). Accordingly, the stand-by oscillator which is in operation hitherto is stopped to operate and the active time oscillator having a large electric current supplying capacity is started to operate instead. As a result, the substrate voltage VBS starts to be decreased. At this time, the voltage VA at the node A is maintained at the power source voltage VCC (H-level) up to the time when the voltage VA becomes a voltage slightly small than the predetermined threshold voltage due to the feedback action of the transistor Q5 of the hysteresis circuit 4, so that the substrate voltage VSB is decreased up to a predetermined negative value during that time period. Thereafter, if the voltage VA becomes lower than the predetermined threshold voltage, the controlling voltage VAC is switched from the H-state to the L-state, so that the active time oscillator is stopped to operate and the stand-by oscillator starts to operate instead. Subsequently, such an operation is repeated. Consequently, the circuit shown in FIG. 1 makes it possible to maintain the substrate voltage VSB always at a negative value.

With the conventional negative voltage supplying circuit as explained above, due to the fact that in the detection circuit 2, an electric current IS is always flowed between the power source terminal TC and substrate terminal TS through the transistors Q1 and Q2, the negative voltage generating section 6 is disadvantageously required to have an electric current supplying capacity larger than that required in case when the detection circuit 2 is not used.

Thus, an object of this invention is to provide a semiconductor integrated circuit capable of detecting a voltage of a semiconductor substrate without making an electric current supplying capacity of a negative voltage generating circuit larger than that required when a detection circuit is not provided.

SUMMARY OF THE INVENTION

In a first aspect of this invention, a semiconductor integrated circuit is provided, which comprises a detection circuit for detecting a voltage of a semiconductor substrate and a negative voltage generating circuit for generating a negative voltage to be supplied to the substrate in accordance with an output of the detection circuit. The detection circuit includes a first P-channel MOS transistor having the gate connected to the ground potential end, the source connected to a power source terminal for receiving a power source voltage from an external power source and the drain connected to a node to be supplied with an output of the detection circuit, and a second P-channel MOS transistor having the gate connected to the substrate, the source connected to the node and the drain connected to the ground petential end.

In the semiconductor integrated circuit of this aspect since the second MOS transistor has the gate connected to the substrate and the drain connected to the ground petential end, an electric current does not flow from the external power source to the substrate. Accordingly, even if the electric current supplying capacity of the negative voltage generating circuit is not made large than that when the detection circuit is not provided, a voltage of the substrate can be detected.

The semiconductor integrated circuit of this aspect is preferable to has a buffer circuit for outputting a signal having a first and second logical state in accordance with the signal level of the node, and a plurality of ring oscillators which are to be switched in accordance with the logical state of the output signal of the buffer circuit thereby supplying an electric current to the negative voltage generating circuit. In this case, the ring oscillators can be controlled in accordance with the detected voltage of the substrate.

The buffer circuit is preferable to have a logical gate including of P-channel MOS transistors as a first stage one. As a result, it is advantageous in that a possible change in the voltage of a substrate due to a variation in threshold voltage generally induced in MOS transistors caused by the production process can be decreased. Besides, it is advantageous in that a possible decrease in threshold voltage when the voltage of the substrate is increased as in the case that N-channel MOS transistors are used can be eliminated. The logical gate is preferable to be a PMOS inverter.

In a second aspect of this invention, a semiconductor integrated circuit is provided, which is different from the first aspect in that the source of the first MOS transistor of the detection circuit in the semiconductor integrated circuit of the first aspect is not connected to a power source terminal as in the first aspect but to a reference voltage terminal to be supplied with a reference voltage. In case that one external power source is used, the reference voltage is generated by lowering the voltage of the external power source, but in case that more than two external power sources are used, it does not apply to the case.

With the semiconductor integrated circuit in the second aspect, the same effects as in the first aspect can be obtained and at the same time, the voltage detection can be stably operated because the detection circuit is not influenced by the variation of a power source voltage.

Similar to the first aspect, the semiconductor integrated circuit in the second aspect is preferable to have a buffer circuit and a plurality of ring oscillators as shown in the first aspect, or to have a logical gate including of P-channel MOS transistors as a first stage one. In case that the buffer circuit is provided, it is preferable to supply a reference voltage to the buffer circuit from the reference voltage terminal.

DESCRIPTION OF THE PREFERRED EMBODIMENTS

Figure 1:
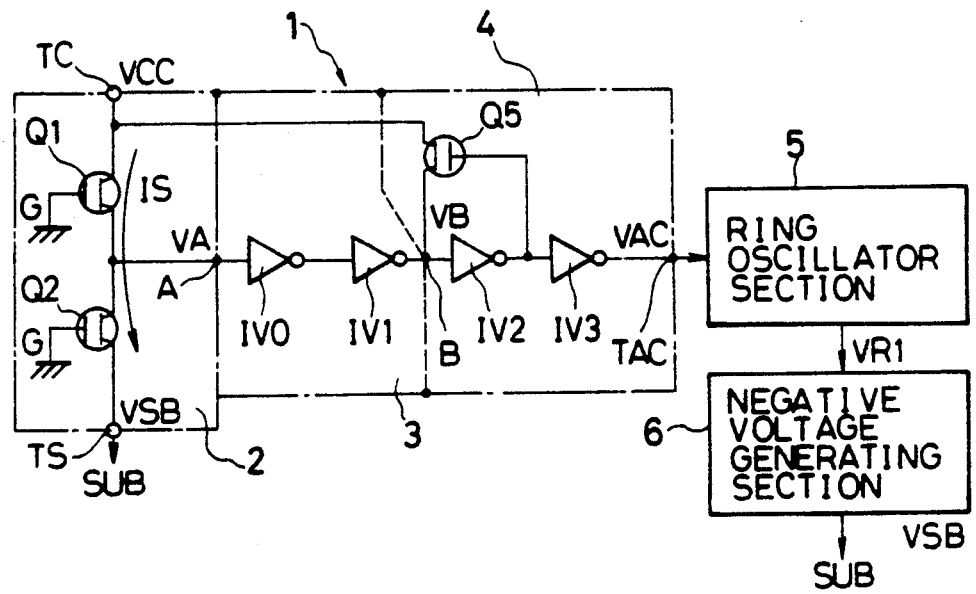
FIG. 1 is a circuit diagram of a conventional semiconductor integrated circuit having a circuit for supplying a negative voltage to a semiconductor substrate.

Some embodiments of this invention will be described below while referring to the drawings attached.

First embodiment

Figure 2:
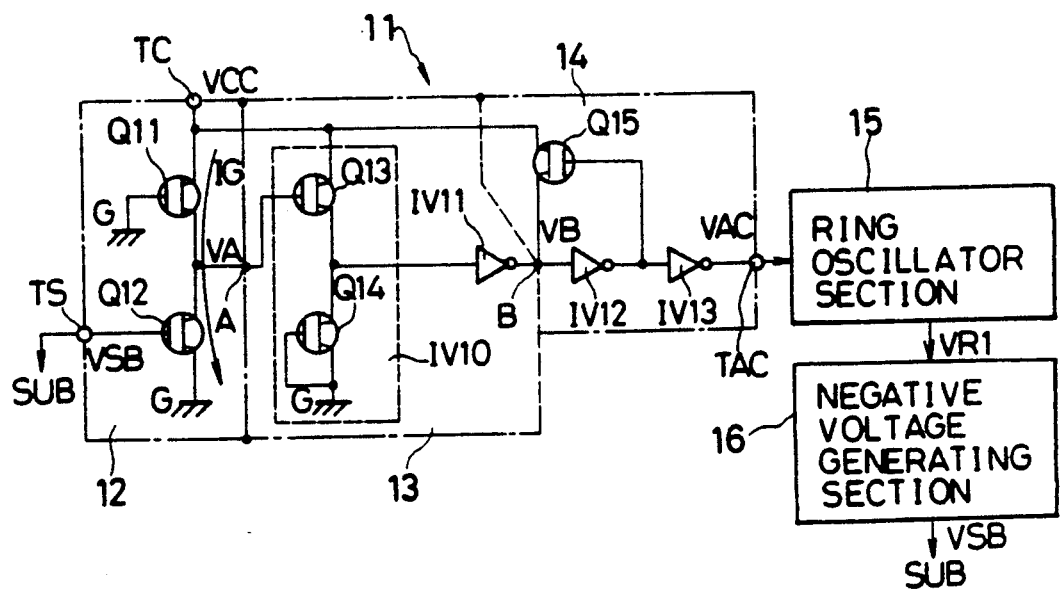
FIG. 2 is a circuit diagram of a semiconductor integrated circuit according to a first embodiment of this invention.
Figure 3:
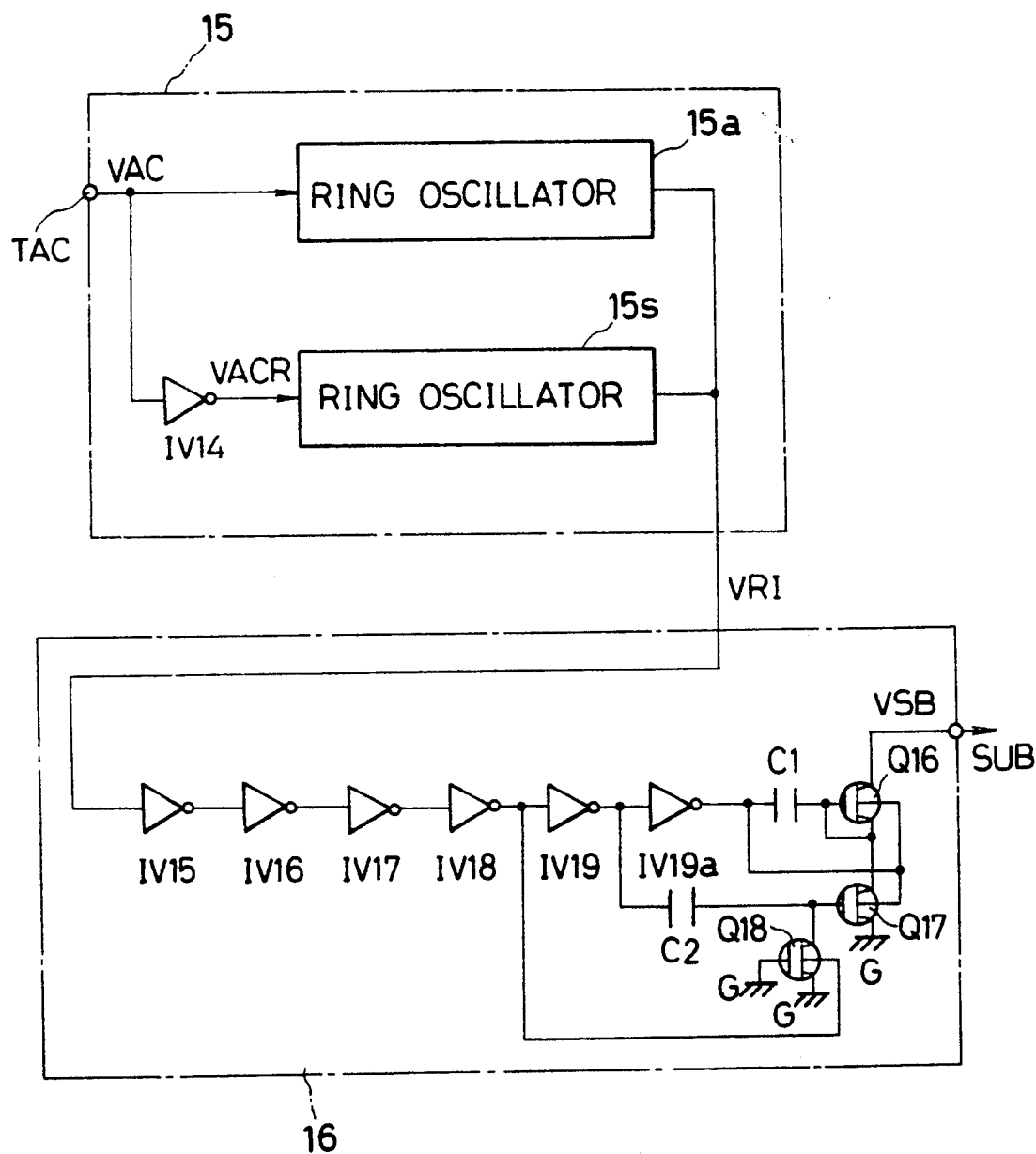
FIG. 3 is a circuit diagram of a ring oscillator circuit and a negative voltage generating circuit of the circuit shown in FIG. 2.

FIGS. 2 and 3 show a negative voltage supplying circuit according to a first embodiment of this invention, in which a negative voltage is supplied to a semiconductor substrate of a DRAM.

A negative voltage supplying circuit shown in FIGS. 2 and 3 comprises a ring oscillator section 15 having a ring oscillator 15a for the active time use and a ring oscillator 15s for the stand-by time use, a ring oscillator controlling section 11 for switching the two ring oscillators 15a and 15s and a negative voltage generating section 16 for generating a negative voltage in accordance with an output of the ring oscillator circuit 15.

The ring oscillator controlling section 11 comprises a detection circuit 12 for detecting a voltage of a semiconductor substrate SUB, a buffer circuit 13 connected to the detection circuit 12, and a hysteresis circuit 14 connected to the buffer circuit 13.

The detection circuit 12, similar to the conventional one already explained above, has two P-channel MOS transistors Q12 and Q13 connected in series. The transistor Q11 disposed on the side of a power source terminal TC is connected in the same way as in the transistor Q1 of the conventional circuit shown in FIG. 1, but the transistor Q12 disposed on the side of the substrate SUB is differently connected from the transistor Q2 shown in FIG. 1. Namely, the transistor Q11 has the gate connected to an ground potential end G, the source connected to the power source terminal TC and the drain connected to a node A, and on the other hand, the transistor Q12 has the drain connected to the ground potential end G, the source connected to the node A and the gate connected to a substrate terminal TS.

In this embodiment, a negative substrate voltage VSB is applied not to the drain but to the gate of the P-channel MOS transistor Q12, so that an electric current IG is flowed between the power source terminal TC and the ground potential end G but not flowed between the power source terminal TC and the substrate terminal TS. As a result, the substrate voltage VSB can be detected by the detection circuit 12 without flowing an electric current from an external power source into the substrate SUB.

To the power source terminal TC, a positive power source voltage VCC is supplied and to the substrate terminal TS, a negative voltage of the substrate SUB is supplied. To the node A, an output voltage of the detection circuit 12, that is, voltage VA corresponding to the detected voltage of the substrate SUB is supplied.

The buffer circuit 13 has a PMOS inverter IV10 and a CMOS inverter IV11 connected in series. The PMOS inverter IV10 has two P-channel MOS transistors Q13 and Q14. The MOS transistor Q13 disposed near the power source terminal TC has the gate connected to the node A, the source connected to the power source terminal TC and the drain connected to the source of the MOS transistor Q14. The MOS transistor Q14 disposed apart from the power source terminal TC has the gate and drain which are connected to the ground potential end G.

In this embodiment, the buffer circuit 13 has the PMOS inverter IV10 as a first stage one, so that a possible change in the substrate voltage VSB due to the variation of threshold voltage to be induced generally in MOS transistors caused by the IC production process can be reduced. In addition, a possible decrease in threshold voltage when the substrate voltage VSB is increased as in case of being a N-channel MOS transistor can be eliminated.

An output of the PMOS inverter IV10 is taken out from the connecting point of the transistors Q13 and Q14 and inputted to the CMOS inverter IV11. An output voltage VB of the CMOS inverter IV11, or the buffer circuit 13 is supplied to the node B. The output voltage VB of the buffer circuit 13 may take two logical stages, high (H) and low (L), accoding to the level of an output signal of the detection circuit 12.

The hysteresis circuit 14 comprises two CMOS inverters IV12 and IV13 connected in series and a P-channel MOS transistor Q15. The transistor Q15 has the source connected to the power source terminal TC, the drain connected to the node B and the gate connected to the connecting point of the inverters IV12 and IV13. The hysteresis circuit 14 receives an output voltage, which is H or L in logical state, from the buffer circuit 13 and supplies a ring oscillator controlling voltage VAC to a terminal TAC, which is similar in structure to the hysteresis circuit 4 of the conventional one shown in FIG. 1. The ring oscillator controlling voltage VAC also takes the H- or L-logical state.

The ring oscillator section 15 has, as shown in FIG. 3, a ring oscillator 15a for the active time use and a ring oscillator 15s for the stand-by time use. To the active time oscillator 15a, the controlling voltage VAC is directly inputted through the terminal TAC, and to the stand-by time oscillator 15s, a controlling voltage VACR obtained by inverting the H- or L-logical state of the controlling voltage VAC through an inverter IV14 is inputted. As a result, only one of the two oscillators 15a and 15s is operated depending on the logical state of the controlling signal VAC supplied from the ring oscillator controlling section 11. In this embodiment, when the controlling voltage VAC is under the L-state, the stand-by time oscillator 15s is operated and when it is under the H-state, the active time oscillator 15a is operated.

The active time oscillator 15a is operated mainly in the active time when an electric current flowed into the substrate SUB is large and supplies an electric current to the negative voltage generating section 16. The oscillator 15a operates at a short period and has a large electric current supplying capacity. The stand-by time oscillator 15s operates mainly in the stand-by time when an electric current flowed into the substrate SUB is small and supplies an electric current to the negative voltage generating section 16. The oscillator 15s operates at a long period to reduce the consumption of an electric current in the stand-by time and has a small electric current supplying capacity.

The negative voltage generating section 16 comprises six inverters IV15 to IV19a connected in series, two capacitors C1 and C2, and three P-channel MOS transistors Q7 to Q9. the negative voltage generating section 16 generates a predetermined negative voltage in accordance with a controlling voltage IRI sent from the ring oscillator section 15 and supplies it to the substrate SUB. So far as the negative voltage generating section 16 is concerned, there is no point to be emphasized newly, detailed explanations on this will be omitted.

Figure 5:
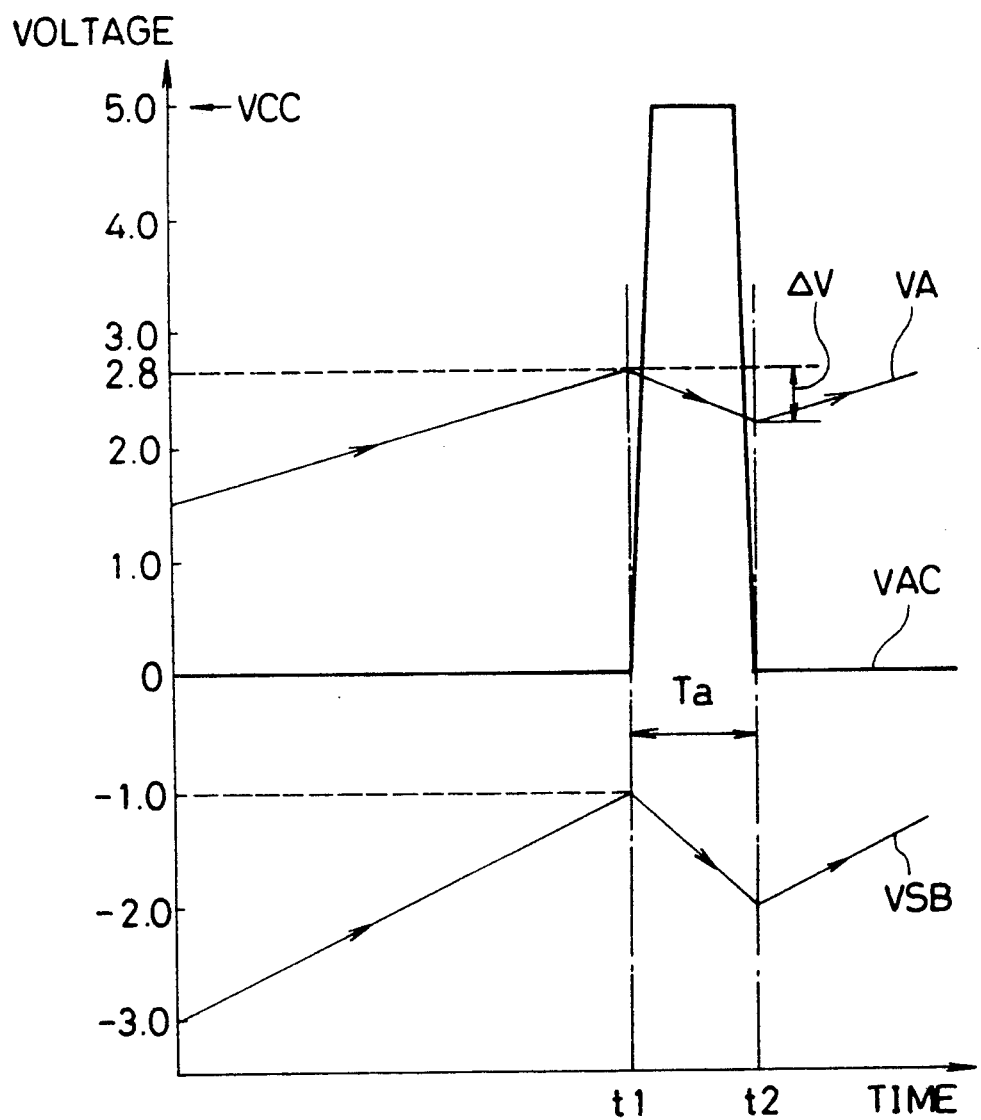
FIG. 5 is waveform diagrams of a voltage at node A, a ring oscillator controlling voltage and a substrate voltage for explaining operation of the circuit shown in FIG. 2.

Next, the operation of the negative voltage supplying circuit shown above will be explained below by referring to FIG. 5.

When the DRAM is under the stand-by state, if the voltage VSB of the substrate SUB set at −3 V is increased to be approached to zero (0) V, this change is detected by the detection circuit 12, and the voltage VA at the node A set at 1.5 V is gradually increased as the voltage VSB is increased. And at a time point t1 when the voltage VSB is attained to −1.0 V, the voltage VA is attained to 2.8 V, but at this time point, the logical state of the buffer circuit 13 is converted. Namely, the controlling voltage VAC for switching the ring oscillators 15a and 15s outputted from the buffer circuit 13 is changed from the previous value of 0 V (L-level) to +5.0 V (H-level) which is equal to the voltage VCC of the external power source.

Accordingly, the stand-by time oscillator 15s which is supplying the voltage VRI to the negative voltage generating section 6 up to the time point t1 is stopped to operate, and the active time oscillator 15a with a large electric current supplying capacity starts to operate instead thereby supplying the voltage VRI to the negative voltage generating section 6. As a result, the voltage VSB of the substrate SUB starts to be decreased.

Here, due to the feedback action of the P-channel MOS transistor Q15 of the hysteresis circuit 14, the controlling voltage VAC is maintained at +5.0 V up to the time point when the voltage VA at the node A is lowered by ΔV (about 0.5 V) from +2.8 V. During which, the substrate voltage VSB is lowered up to such a degree (here, up to about −2.0 V) that does not generate any trouble even switched to the stand-by time oscillator 15s.

Therefore, at a time point t2 when the substrate voltage VSB is lowered, the logical state of the buffer circuit 13 is inverted again. Namely, the controlling voltage VAC for switching the ring oscillators 15a and 15s outputted from the buffer circuit 13 is changed from +5.0 V (H-level) to 0 V (L-level). Consequently, the active time oscillator 15a is stopped to operate, and the stand-by time oscillator 15s starts to operate instead. As a result, when the substrate voltage VSB starts to be increased again, the logical state of the buffer circuit 13 is inverted at the time point when the voltage VSB is attained to −1.0 V thereby switching the ring oscillator 15s to the ring oscillator 15a to be operated instead. Thus, the voltage VSB of the substrate SUB can be maintained always at a negative voltage of a predetermined range.

As shown above, the negative voltage supplying circuit of this embodiment makes it possible to maintain the substrate voltage VSB at a negative value while reducing the consumption of an electric current by operating the active time ring oscillator 15a at a long period and the stand-by time ring oscillator 15s at a short period Ta.

Second Embodiment

Figure 4:
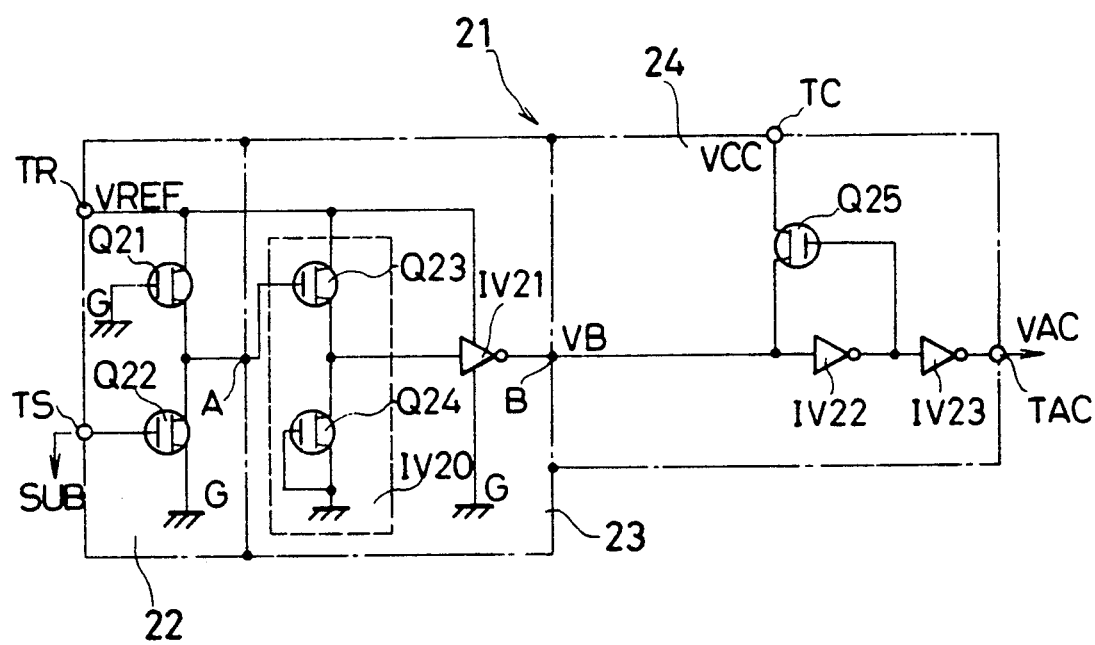
FIG. 4 is a circuit diagram of a semiconductor integrated circuit according to a second embodiment of this invention.

FIG. 4 shows a negative voltage supplying circuit according to a second embodiment of this invention, in which a negative voltage is supplied to a semiconductor substrate of a DRAM.

In FIG. 4, a ring oscillator section and a negative voltage generating section are omitted. The circuit of this embodiment is substantially equal in structure to that of the first embodiment, but different therefrom in that a detection circuit and buffer circuit are supplied not with a voltage VCC of an external power source, but with a reference voltage VREF.

In this embodiment, similar to the first embodiment, the ring oscillator section has a ring oscillator for the active time use and a ring oscillator for the stand-by time use, which are operably switched by a ring oscillator controlling section 21, and the negative voltage generating section generates a negative voltage in accordance with an output voltage VAC of the ring oscillator section.

The ring oscillator controlling section 21 comprises, similar to the first embodiment, a detection circuit 22 for detecting a voltage of a substrate SUB, a buffer circuit 23 connected to the detection circuit 22 and a hysteresis circuit 24 connected to the buffer circuit 23.

The detection circuit 22 has two P-channel MOS transistors Q21 and Q22 connected in series. The one transistor Q21 has the gate connected to an ground potential end G and the drain connected to a node A as in the first embodiment, but has the source connected to a reference voltage terminal TR to be supplied with the reference voltage VREF differently from the first embodiment. The other transistor Q22 has the drain connected to the ground potential end G, the source connected to the node A and the gate connected to a substrate terminal TS, as in the first embodiment.

To the reference voltage terminal TR, a positive reference voltage VREF is supplied, and to the substrate terminal TS, a negative voltage of the substrate SUB is supplied. To the node A, an output voltage VA of the detection circuit 22 is supplied. The reference voltage VREF is supplied through a reference voltage generating circuit (not shown) to be generally used for an integrated circuit as a DRAM. In this embodiment, the external power source voltage VCC of +5 V is lowered to obtain the reference voltage of +3 V. The reference voltage VREF is maintained at a constant value if the power source voltage VCC is made higher than the reference voltage VREF.

The buffer circuit 23 has, similar to the first embodiment, a PMOS inverter IV20 and a CMOS inverter IV21 connected in series. The PMOS inverter IV20 has two P-channel MOS transistors Q23 and Q24. The MOS transistor Q23 has the gate connected to the node A and the drain connected to the source of the MOS transistor Q24 as in the first embodiment, but has the source connected not to the power source terminal TC but to the reference voltage terminal TR differently therefrom. The MOS transistor Q24 has the gate and drain connected to the ground potential end G as in the first embodiment. The CMOS inverter IV21 has one power source receiving terminal connected to the reference voltage terminal TR and the other terminal connected to the ground potential end G.

As output of the PMOS inverter IV20 is taken out through the connecting point of the transistors Q23 and Q24 and inputted to the CMOS inverter IV21. The output voltage VB of the buffer circuit 23 is maintained at the H- or L-level depending on the level of an output signal of the detection circuit 22.

The hysteresis circuit 24 has, similar to the first embodiment, two CMOS inverters IV22 and IV23 connected in series, and a P-channel MOS transistor Q25. The transistor Q25 has the source connected to the power source terminal TC, the drain connected to a node B and the gate connected to the connecting point of the inverters IV22 and IV23. The hysteresis circuit 24 receives an output voltage from the buffer circuit 23 and outputs a ring oscillator controlling voltage VAC having the H- or L-logical state to an output terminal TAC.

The negative voltage supplying circuit of this second embodiment as shown above operates equally to that of the first embodiment and as a result, the same effects as those of the first one can be obtained. Furthermore, the operation of the detection circuit 22 is not influenced by the variation of the power source voltage VCC and as a result, the detection of the substrate voltage VSUB can be stably achieved. In addition, the output voltage at the H-level (maximum output voltage) of the buffer circuit 23 becomes equal to the reference voltage VREF and as a result, its operation is not influenced by the variation of the voltage VCC, resulting in the stable operation thereof.

In the above-mentioned embodiments, the hysteresis circuit is provided between the buffer circuit and the ring oscillator circuit, but not limited thereto, if the hysteresis circuit is not provided, this invention can be practically applied. In addition, the PMOS inverter is provided as a first stage circuit of the buffer circuit, but not limited thereto, a CMOS inverter can be provided instead. Further in addition, two ring oscillators respectively for the active time and stand-by time uses are provided, but not limited thereto, more than three ring oscillators may be provided.

In the first and second embodiments, the descriptions were made on the case that this invention is applied for a negative voltage supplying circuit of a DRAM, but not limited thereto, this invention can be applied for any other semiconductor integrated circuits.

What is claimed is:
1. A semiconductor integrated circuit comprising:
   a detection circuit for detecting a voltage of a semiconductor substrate; and
   a negative voltage generating circuit for generating a negative voltage to be supplied to said substrate in accordance with the output signal from said detection circuit;
   said detection circuit including a first P-channel MOS transistor having the gate connected to a ground potential end, the source connected to a power source terminal for receiving a power source voltage from an external power source and the drain connected to a node to be supplied with an output of said detection ciuduit, and a second P-channel MOS transistor having the gate connected to said substrate, the source connected to said node and the drain connected to said ground potential end.

2. A semiconductor integrated circuit as claimed in claim 1 comprising a buffer circuit for outputting a signal having a first and second logical state in accordance with a voltage level of said node, and a plurality of ring oscillators which are to be switched in accordance with the logical state of the output signal of said buffer circuit thereby supplying an electric current to said negative voltage generating circuit.

3. A semiconductor integrated circuit as claimed in claim 2, wherein said buffer circuit has a logical gate including of P-channel MOS transistors at a first stage thereof.

4. A semiconductor integrated circuit as claimed in claim 3, wherein said logical gate includes a PMOS inverter.

5. A semiconductor integrated circuit comprising:
a detection circuit for detecting a voltage of a semiconductor substrate; and
a negative voltage generating circuit for generating a negative voltage to be supplied to said substrate in accordance with the output signal from said detection circuit;

said detection circuit including a first P-channel MOS transistor having the gate connected to a ground potential end, the source connected to a reference voltage terminal for receiving a reference voltage, and the drain connected to a node to be supplied with an output of said detection circuit, and a second P-channel MOS transistor having the gate connected to said substrate, the source connected to said node and the drain connected to said ground potential end.

6. A semiconductor integrated circuit as claimed in claim 5 comprising a buffer circuit for outputting a signal having a first and second logical state in accordance with a voltage level of said node, and a plurality of ring oscillators which are to be switched in accordance with the logical state of the output signal of said buffer circuit thereby supplying an electric current to said negative voltage generating circuit.

7. A semiconductor integrated circuit as claimed in claim 6, wherein said buffer circuit has a logical gate including P-channel MOS transistors at a first stage thereof.

8. A semiconductor integrated circuit as claimed in claim 6, wherein said buffer circuit is supplied with a reference voltage from said reference voltage terminal.

9. A semiconductor integrated circuit as claimed in claim 7, wherein said logical gate includes a PMOS inverter.

* * * * *